US012690202B2

(12) United States Patent
Lin et al.

(10) Patent No.: US 12,690,202 B2
(45) Date of Patent: Jul. 21, 2026

(54) METHOD OF FORMING CAPACITOR

(71) Applicant: NANYA TECHNOLOGY CORPORATION, New Taipei city (TW)

(72) Inventors: Kai Hung Lin, Taichung City (TW); Jyun-Hua Yang, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 378 days.

(21) Appl. No.: 18/492,451

(22) Filed: Oct. 23, 2023

(65) Prior Publication Data

US 2025/0133754 A1     Apr. 24, 2025

(51) Int. Cl.
H10D 1/68          (2025.01)
H10B 12/00          (2023.01)

(52) U.S. Cl.
CPC ............. H10D 1/692 (2025.01); H10B 12/03 (2023.02)

(58) Field of Classification Search
None
See application file for complete search history.

(56) References Cited

U.S. PATENT DOCUMENTS

| | | | |
|---|---|---|---|
| 6,352,889 B1 | 3/2002 | Nishitsuji | |
| 2005/0196917 A1* | 9/2005 | Lian | H10D 1/68 |
| | | | 438/785 |
| 2006/0086952 A1* | 4/2006 | Kim | H10B 12/033 |
| | | | 257/211 |
| 2013/0330903 A1* | 12/2013 | Malhotra | H10D 1/692 |
| | | | 438/396 |
| 2016/0087028 A1* | 3/2016 | Hirota | H01L 21/02164 |
| | | | 257/532 |
| 2016/0268141 A1* | 9/2016 | Hudson | H01J 37/32091 |
| 2016/0358793 A1* | 12/2016 | Okumura | C23C 16/453 |

FOREIGN PATENT DOCUMENTS

| | | |
|---|---|---|
| TW | 495923 B | 7/2002 |

* cited by examiner

*Primary Examiner* — Bilkis Jahan
(74) *Attorney, Agent, or Firm* — CKC & Partners Co., LLC

(57)          ABSTRACT
The present disclosure provides a method of forming a capacitor. The method includes the following operations. A metal oxide insulating layer is formed on a first conductive layer with a first temperature, in which the first temperature is lower than a crystallization temperature of the metal oxide insulating layer. A second conductive layer is formed on the metal oxide insulating layer with a second temperature. An insulating layer is formed on the second conductive layer with a third temperature to crystallize the metal oxide insulating layer to form a crystallized metal oxide insulating layer, in which the second temperature is between the first temperature and the third temperature.

19 Claims, 12 Drawing Sheets

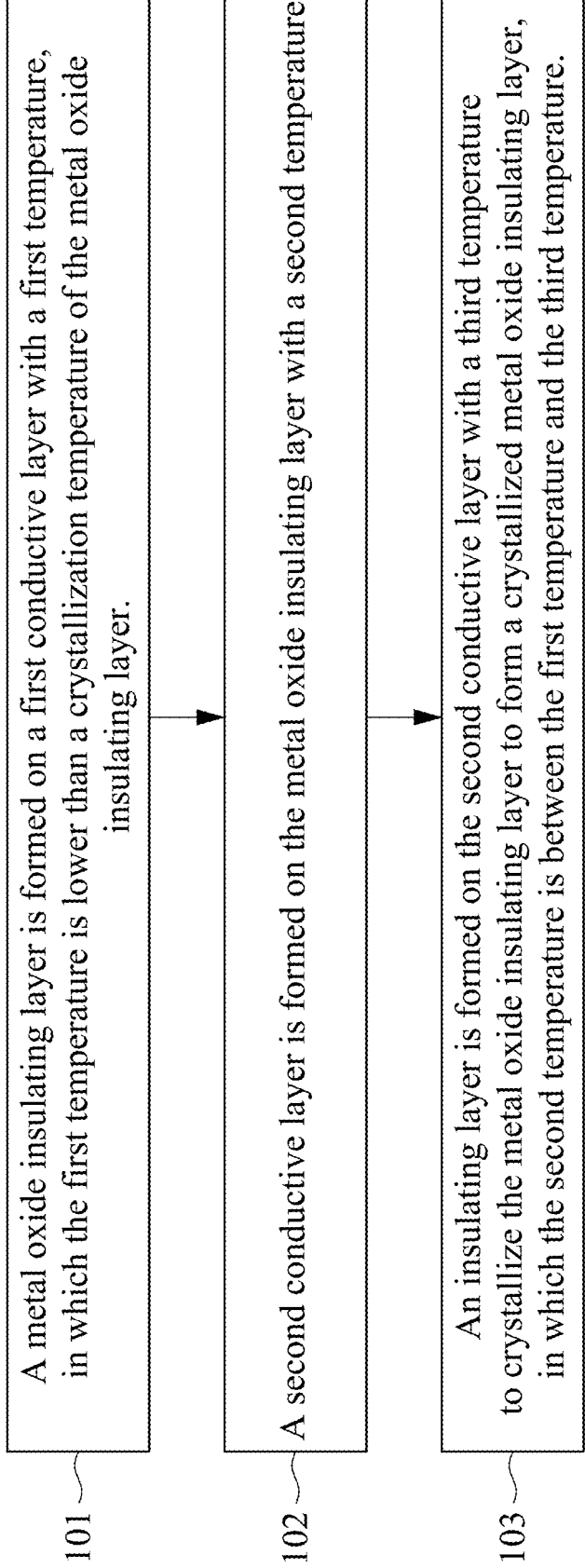

100

101 — A metal oxide insulating layer is formed on a first conductive layer with a first temperature, in which the first temperature is lower than a crystallization temperature of the metal oxide insulating layer.

102 — A second conductive layer is formed on the metal oxide insulating layer with a second temperature.

103 — An insulating layer is formed on the second conductive layer with a third temperature to crystallize the metal oxide insulating layer to form a crystallized metal oxide insulating layer, in which the second temperature is between the first temperature and the third temperature.

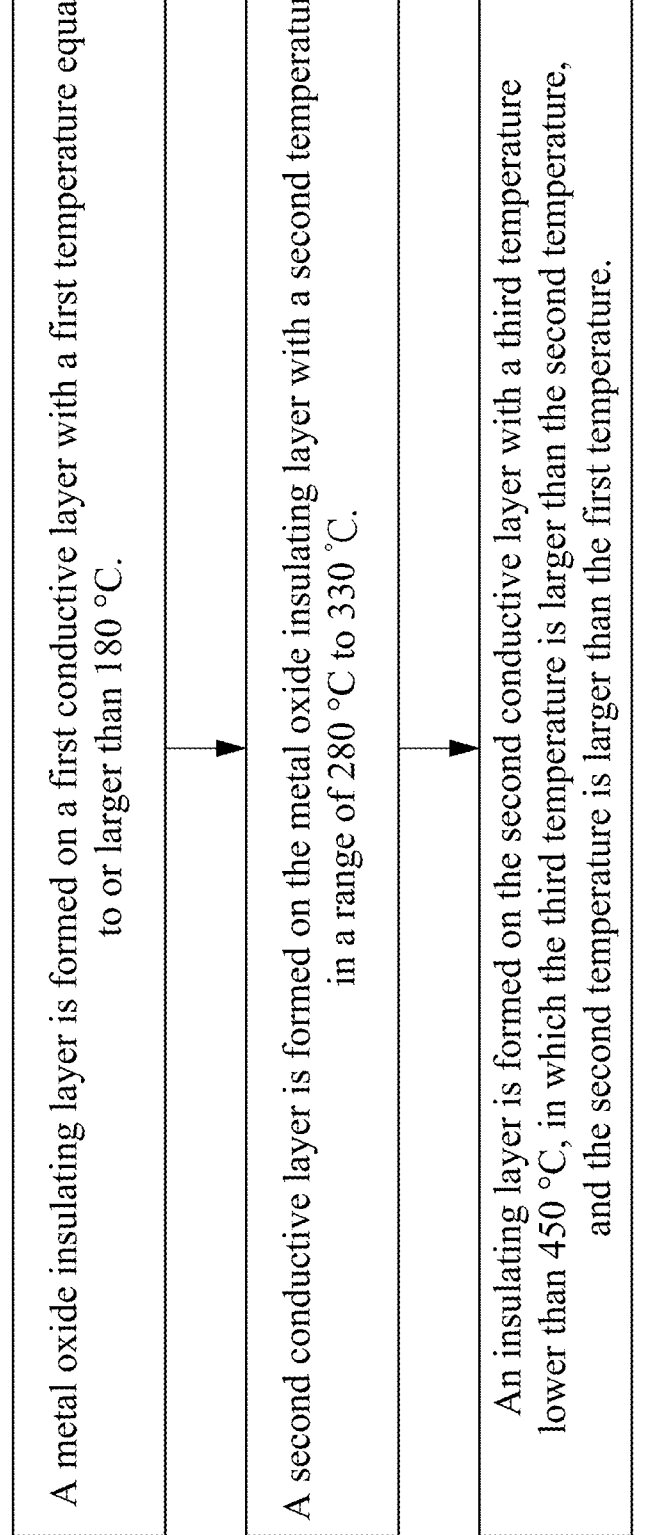

301 — A metal oxide insulating layer is formed on a first conductive layer with a first temperature equal to or larger than 180 °C.

302 — A second conductive layer is formed on the metal oxide insulating layer with a second temperature in a range of 280 °C to 330 °C.

303 — An insulating layer is formed on the second conductive layer with a third temperature lower than 450 °C, in which the third temperature is larger than the second temperature, and the second temperature is larger than the first temperature.

Fig. 11

METHOD OF FORMING CAPACITOR

BACKGROUND

Field of Invention

The present disclosure relates to a method of forming a capacitor.

Description of Related Art

A memory cell that includes a capacitor and a transistor is a basic unit in a memory device to store digital data. Digital data is stored as charges in the capacitor. The transistor controls the charging and discharging of the capacitor. However, as the memory device becomes smaller and smaller, having high capacitance in a small capacitor becomes challenging. Also, avoiding current leakage is crucial to have a well-performance memory device while maintaining high capacitance in the capacitor. Therefore, a method of forming a capacitor that has high capacitance and reduced current leakage is important.

SUMMARY

The present disclosure provides a method of forming a capacitor. The method includes the following operations. A metal oxide insulating layer is formed on a first conductive layer with a first temperature, in which the first temperature is lower than a crystallization temperature of the metal oxide insulating layer. A second conductive layer is formed on the metal oxide insulating layer with a second temperature. An insulating layer is formed on the second conductive layer with a third temperature to crystallize the metal oxide insulating layer to form a crystallized metal oxide insulating layer, in which the second temperature is between the first temperature and the third temperature.

In some embodiments, the second temperature is lower than the crystallization temperature of the metal oxide insulating layer.

In some embodiments, the metal oxide insulating layer includes hafnium zirconium oxide, zirconium oxide, hafnium oxide, titanium oxide, or combinations thereof.

In some embodiments, the first temperature is in a range of 180° C. to 280° C.

In some embodiments, the second temperature is larger than the first temperature and equal to or lower than 330° C.

In some embodiments, the third temperature is equal to or larger than 330° C. and is lower than 450° C.

In some embodiments, the method further includes forming the first conductive layer on a cylindrical substrate.

In some embodiments, the crystallized metal oxide insulating layer includes crystals uniformly aligned in lines.

In some embodiments, the method further includes forming the first conductive layer on a cylindrical substrate, and etching the cylindrical substrate to form the first conductive layer in a shape of a hollow cylinder.

In some embodiments, forming the metal oxide insulating layer includes forming an outer metal oxide insulating layer on an outer surface and an inner metal oxide insulating layer on an inner surface of the first conductive layer in the shape of the hollow cylinder, forming the second conductive layer includes forming an outer second conductive layer on the outer metal oxide insulating layer and an inner second conductive layer on the inner metal oxide insulating layer, and forming the insulating layer includes forming an outer insulating layer on the outer second conductive layer and an inner insulating layer on the inner second conductive layer.

In some embodiments, the crystallized metal oxide insulating layer includes crystals uniformly aligned in lines.

In some embodiments, the first conductive layer includes titanium, aluminum, titanium nitride, or combinations thereof, and the second conductive layer includes titanium, aluminum, titanium nitride, or combinations thereof.

The present disclosure also provides a method of forming a capacitor. The method includes the following operations. A metal oxide insulating layer is formed on a first conductive layer with a first temperature equal to or larger than 180° C. A second conductive layer is formed on the metal oxide insulating layer with a second temperature in a range of 280° C. to 330° C. An insulating layer is formed on the second conductive layer with a third temperature lower than 450° C., in which the third temperature is larger than the second temperature, and the second temperature is larger than the first temperature.

In some embodiments, before forming the insulating layer, the metal oxide insulating layer is amorphous, and after forming the insulating layer, the metal oxide insulating layer is crystallized.

In some embodiments, the metal oxide insulating layer includes hafnium zirconium oxide, zirconium oxide, hafnium oxide, titanium oxide, or combinations thereof.

In some embodiments, the method further includes forming the first conductive layer on a cylindrical substrate.

In some embodiments, the crystallized metal oxide insulating layer includes crystals uniformly aligned in lines.

In some embodiments, the method further includes forming the first conductive layer on a cylindrical substrate, and etching the cylindrical substrate to form the first conductive layer in a shape of a hollow cylinder.

In some embodiments, forming the metal oxide insulating layer includes forming an outer metal oxide insulating layer on an outer surface and an inner metal oxide insulating layer on an inner surface of the first conductive layer in the shape of the hollow cylinder, forming the second conductive layer includes forming an outer second conductive layer on the outer metal oxide insulating layer and an inner second conductive layer on the inner metal oxide insulating layer, and forming the insulating layer includes forming an outer insulating layer on the outer second conductive layer and an inner insulating layer on the inner second conductive layer.

In some embodiments, the crystallized metal oxide insulating layer includes crystals uniformly aligned in lines.

The features, aspects, and advantages of the present disclosure are better understood by referring to the following detailed description. It is noted that both the foregoing general description and the following detailed description are merely illustrative and are intended to provide further explanations of the appended claims.

BRIEF DESCRIPTION OF THE DRAWINGS

The present disclosure is best understood from the following detailed description and the accompanying figures. It is noted that the elements in the figures may not be drawn to meet the exact scale. Some elements may be drawn with increased or decreased sizes for clarity of the discussion.

FIG. 1 is a flow chart of a method of forming a capacitor according to some embodiments of the present disclosure.

FIG. 11 is a flow chart of a method of forming a capacitor according to some embodiments of the present disclosure.

DETAILED DESCRIPTION

Figure 2B:
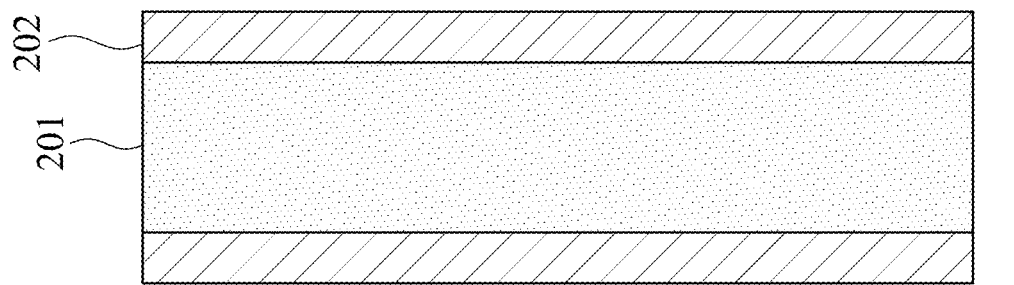
FIGS. 2B, 3B, 4B, and 5B are cross-section-view schematics of a capacitor in the intermediate stages of a method of forming a capacitor according to a first or a third embodiment of the present disclosure.
Figure 2A:
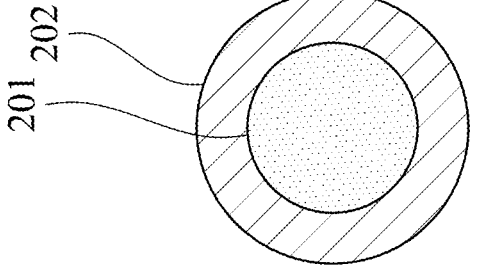
FIGS. 2A, 3A, 4A, and 5A are top-view schematics of a capacitor in the intermediate stages of a method of forming a capacitor according to a first or a third embodiment of the present disclosure.
Figure 3B:
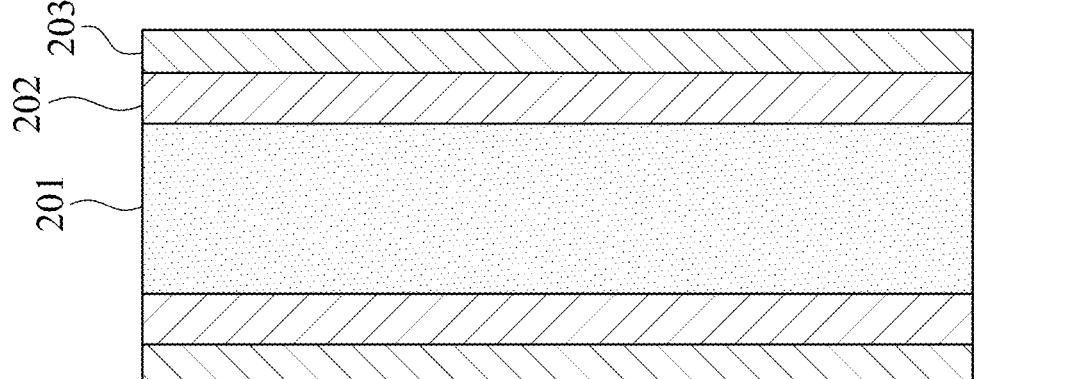
Figure 3A:
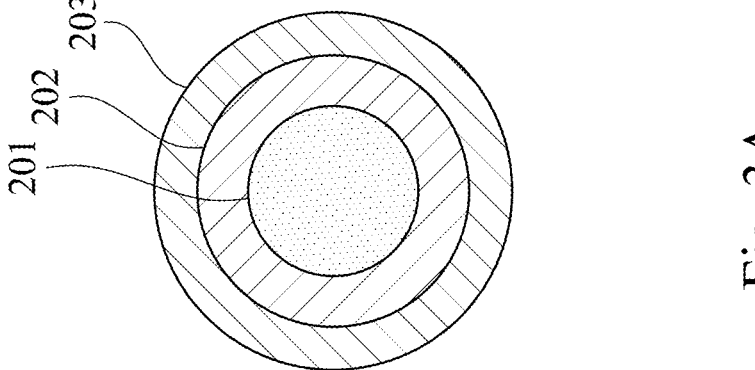
Figure 4B:
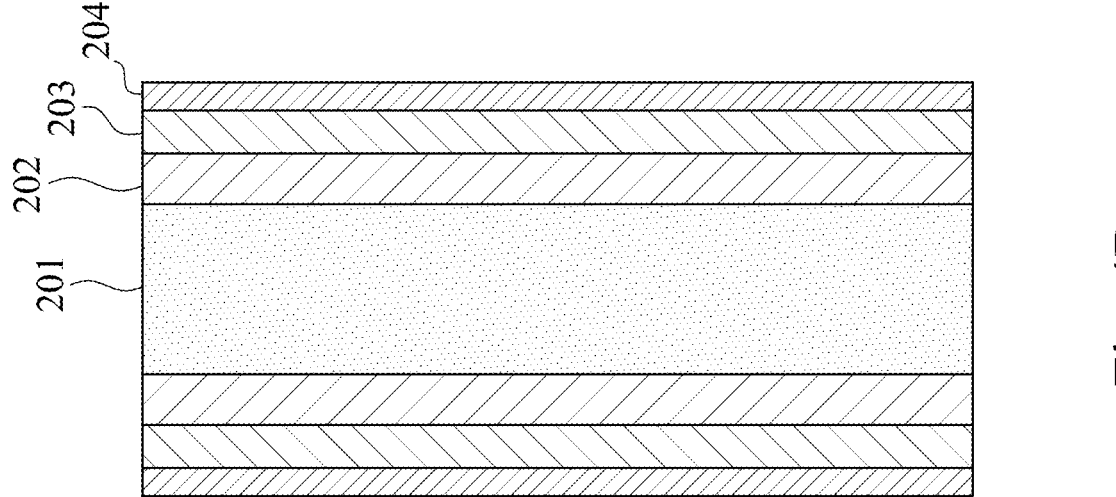
Figure 4A:
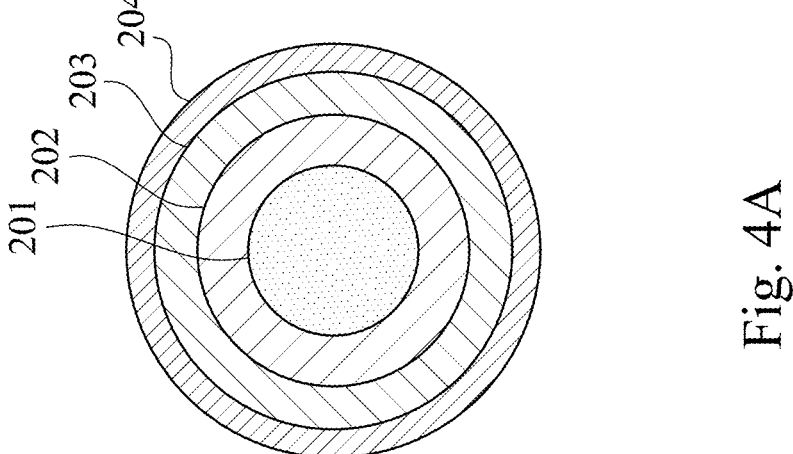
Figure 5B:
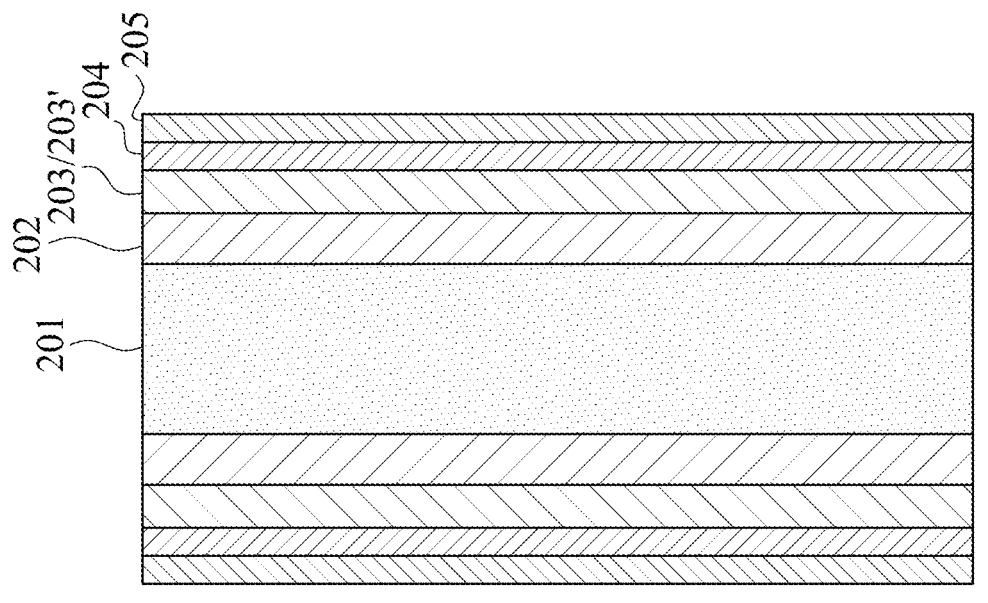
Figure 5A:
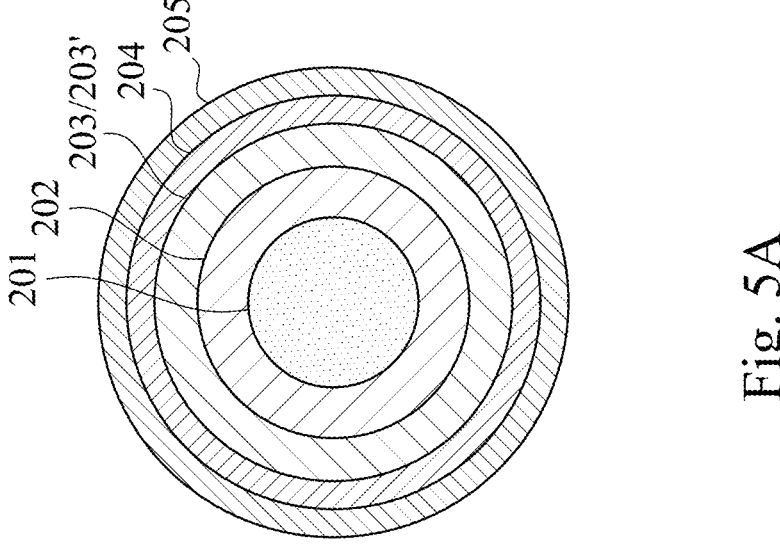
Figure 6B:
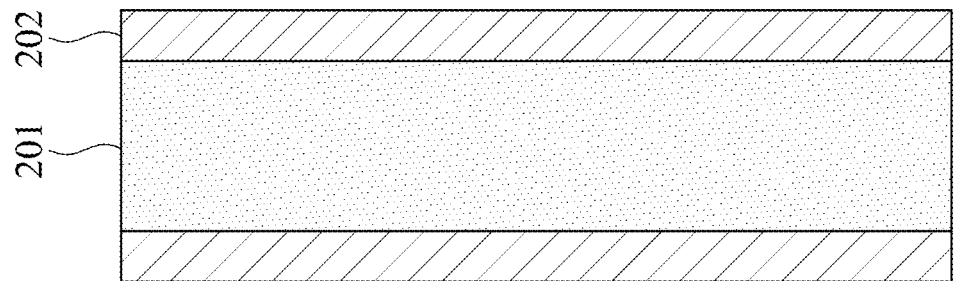
FIGS. 6B, 7B, 8B, 9B, and 10B are cross-section-view schematics of a capacitor in the intermediate stages of a method of forming a capacitor according to a second or a fourth embodiment of the present disclosure.
Figure 6A:
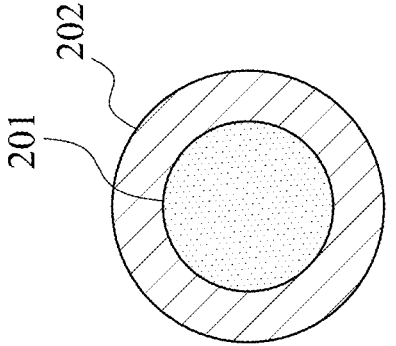
FIGS. 6A, 7A, 8A, 9A, and 10A are top-view schematics of a capacitor in the intermediate stages of a method of forming a capacitor according to a second or a fourth embodiment of the present disclosure.
Figure 7B:
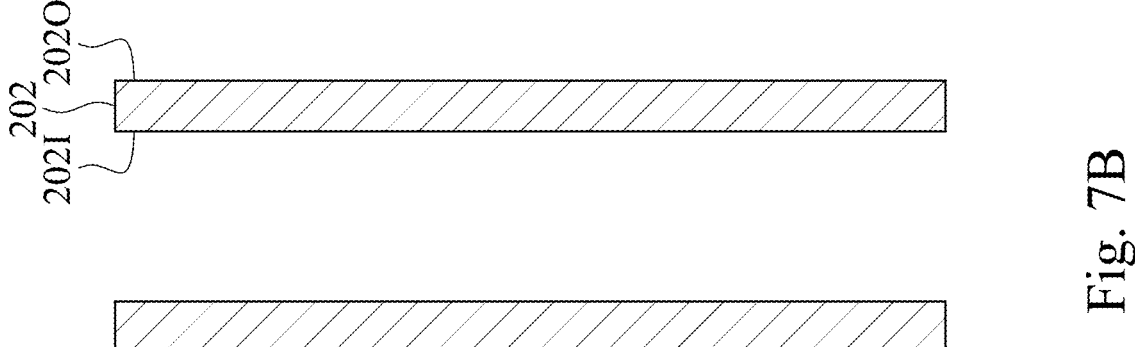
Figure 7A:
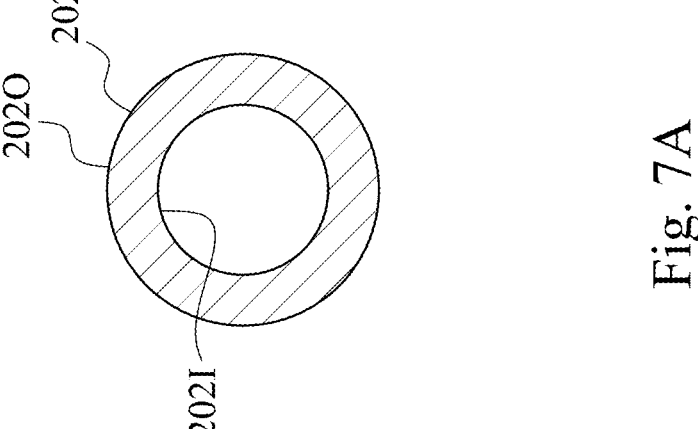
Figure 8B:
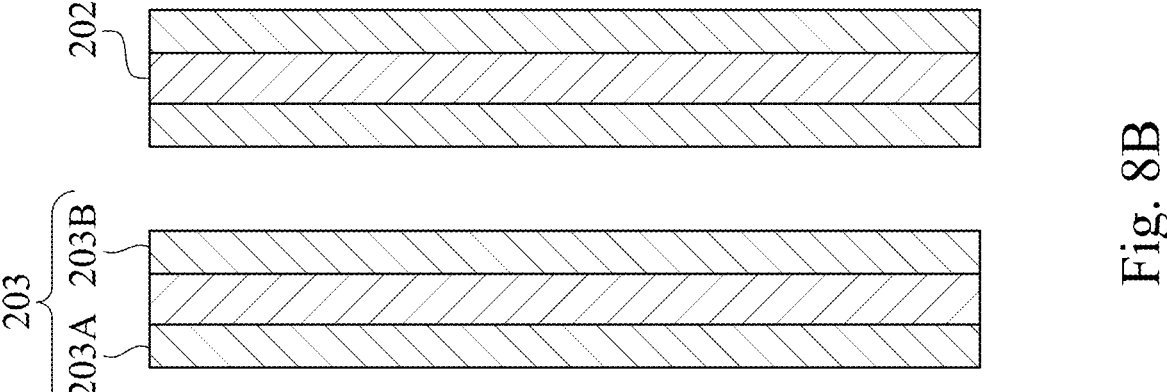
Figure 8A:
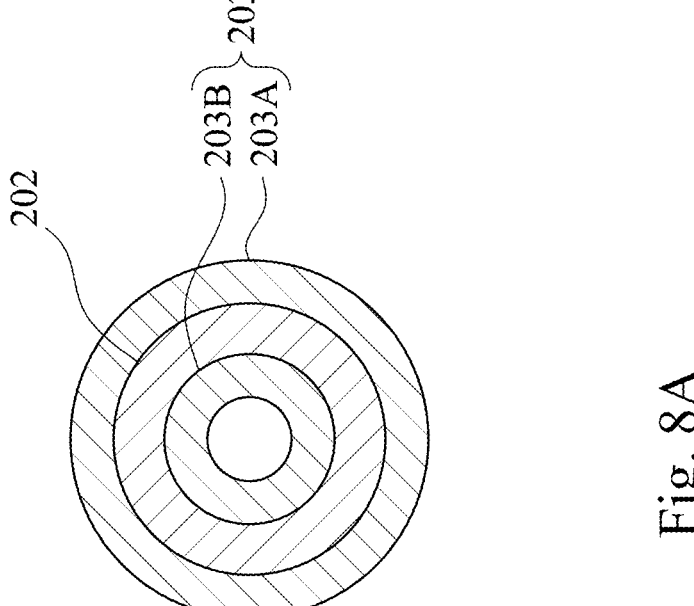
Figure 9B:
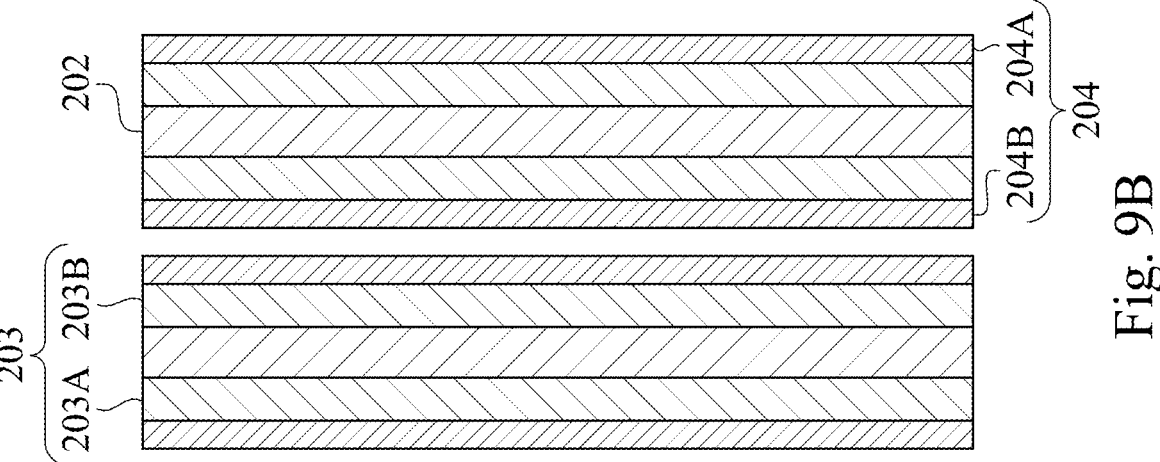
Figure 9A:
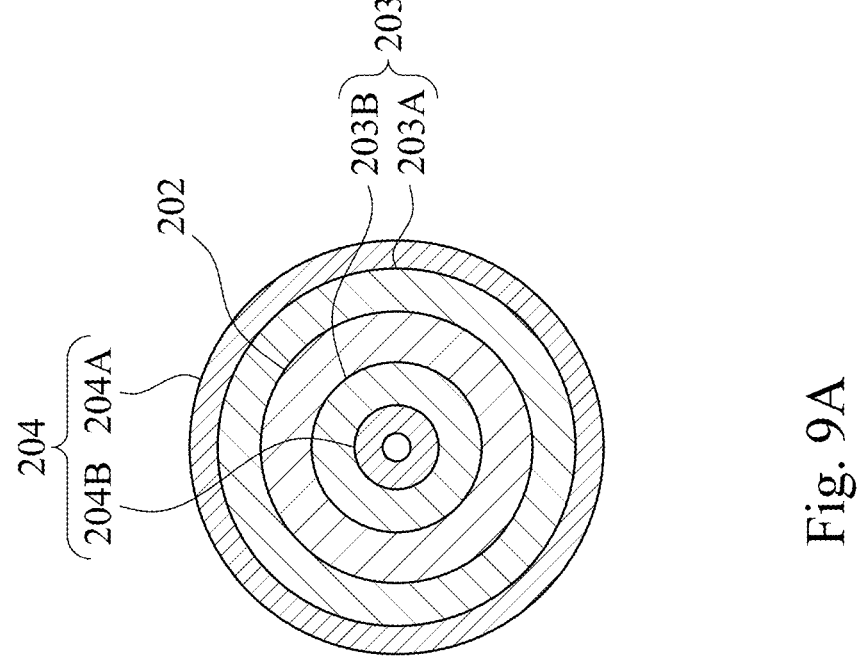
Figures 10A, 10B:
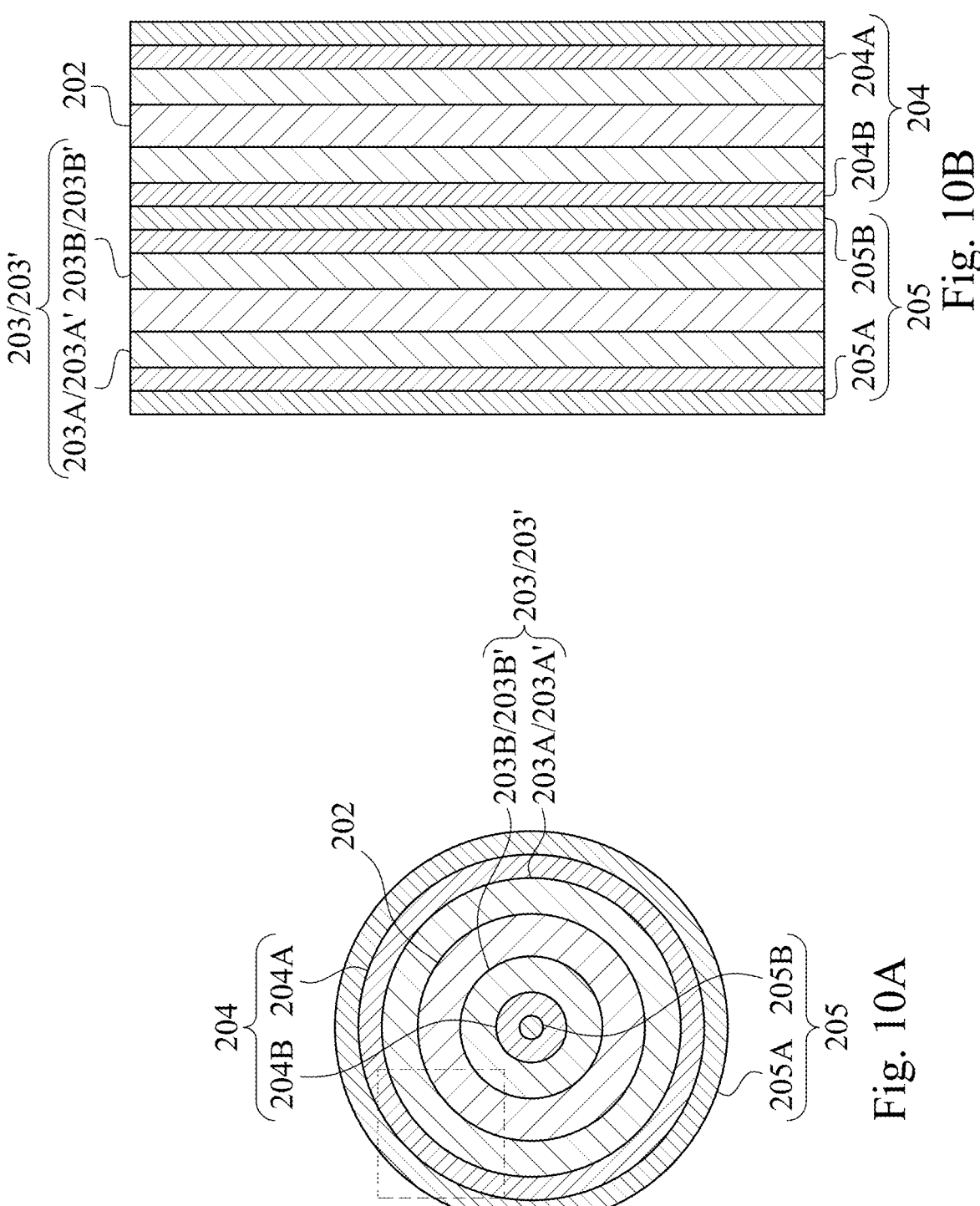

To make the description of the present disclosure more detailed and complete, explanatory descriptions of the aspects and specific implementations of the embodiments are provided below. It is not to limit the embodiments of the present disclosure to only one form. The embodiments of the present disclosure can combine or be substituted with each other under beneficial circumstances. Other embodiments may be appended without further description or explanation.

Furthermore, spatially relative terms, such as below and above, etc., may be used in the present disclosure to describe the relationship of one element or feature to another element or feature in the drawings. In addition to the orientation depicted in the figures, spatially relative terms are intended to encompass different orientations of the device in use or operation. For example, the device may be otherwise oriented (eg, rotated 90 degrees or otherwise) and the spatially relative terms of this disclosure are to be interpreted accordingly. In this disclosure, unless otherwise indicated, the same element numbers in different figures refer to the same or similar elements formed from the same or similar materials by the same or similar methods.

The present disclosure provides a method of forming a capacitor. The method includes the following operations. A metal oxide insulating layer is formed on a first conductive layer with a first temperature, in which the first temperature is lower than a crystallization temperature of the metal oxide insulating layer. A second conductive layer is formed on the metal oxide insulating layer with a second temperature. An insulating layer is formed on the second conductive layer with a third temperature to crystallize the metal oxide insulating layer to form a crystallized metal oxide insulating layer, in which the second temperature is between the first temperature and the third temperature. The detail of the method according to some embodiments is provided below.

FIG. 1 is a flow chart of the method 100 described above according to some embodiments of the present disclosure. FIGS. 2A, 3A, 4A, and 5A in a top view, and FIGS. 2B, 3B, 4B, and 5B in a cross-section view are schematics of the capacitor in the intermediate stages of the method 100 according to a first embodiment of the present disclosure. Please read FIGS. 2A to 5B when reading FIG. 1. FIGS. 6A, 7A, 8A, 9A, and 10A in a top view, and FIGS. 6B, 7B, 8B, 9B, and 10B in a cross-section view are schematics of the capacitor in the intermediate stages of the method 100 according to a second embodiment of the present disclosure.

The difference between the first embodiment and the second embodiment is explained below. Please read FIGS. 6A to 10B when reading FIG. 1.

In FIG. 1, an operation 101 includes forming a metal oxide insulating layer 203 on a first conductive layer 202 with a first temperature, in which the first temperature is lower than a crystallization temperature of the metal oxide insulating layer 203. Please refer to FIGS. 2A and 2B to FIGS. 3A and 3B, and FIGS. 6A and 6B to FIGS. 8A and 8B. In some embodiments, before the operation 101, the first conductive layer 202 can form on any substrate, such as a cylindrical substrate 201 discussed later, and the substrate can be any shape, such as a planar plate or a cylinder. With the help of the first temperature, the materials of the metal oxide insulating layer 203 deposit on the first conductive layer 202 and react to form the metal oxide insulating layer 203. When the first temperature is lower than the crystallization temperature of the metal oxide insulating layer 203, the metal oxide insulating layer 203 formed on the first conductive layer 202 is amorphous. The crystallization of the metal oxide insulating layer 203 is avoided before proceeding to the operations later to avoid too much degree of crystallization that would induce current leakage of the capacitor. In some embodiments, the first temperature is in a range of 180° C. to 280° C., for example, 180° C., 200° C., 220° C., 240° C., 260° C., or 280° C. In some embodiments, the first conductive layer 202 includes titanium, aluminum, titanium nitride, or combinations thereof. In some embodiments, the metal oxide insulating layer 203 includes hafnium zirconium oxide, zirconium oxide, hafnium oxide, titanium oxide, or combinations thereof. In some embodiments, forming the metal oxide insulating layer 203 includes performing an atomic layer deposition (ALD) process.

In some embodiments, the method 100 further includes forming the first conductive layer 202 on a cylindrical substrate 201, such as the first embodiment shown in FIGS. 2A and 2B to FIGS. 3A and 3B. When the first conductive layer 202 is formed on the cylindrical substrate 201, a shape of the first conductive layer 202 is a hollow cylinder, making the metal oxide insulating layer 203 formed on the first conductive layer 202 also a hollow cylinder. In the operation 103 discussed later, the shape of the hollow cylinder will favor the crystallization of the metal oxide insulating layer 203. In some embodiments, the cylindrical substrate 201 includes silicon or silicon dioxide.

In some embodiments, the method 100 further includes forming the first conductive layer 202 on a cylindrical substrate 201, and etching the cylindrical substrate 201 to form the first conductive layer 202 in a shape of a hollow cylinder, such as the second embodiment shown in FIGS. 6A and 6B to FIGS. 8A and 8B. Because the first conductive layer 202 is formed on the cylindrical substrate 201, a shape of the first conductive layer 202 is a hollow cylinder. After etching the cylindrical substrate 201 wrapped inside the first conductive layer 202, an inner surface 2021 and an outer surface 2020 of the first conductive layer 202 are exposed. Therefore, forming the metal oxide insulating layer 203 in the operation 101 includes forming an outer metal oxide insulating layer 203A on the outer surface 2020 of the first conductive layer 202, and forming an inner metal oxide insulating layer 203B on the inner surface 2021 of the first conductive layer 202. The metal oxide insulating layer 203 in the second embodiment includes the outer metal oxide insulating layer 203A and the inner metal oxide insulating layer 203B, and both the outer metal oxide insulating layer 203A and the inner metal oxide insulating layer 203B are in a shape of a hollow cylinder. In the operation 103 discussed later, the shape of the hollow cylinder will favor the crystallization of the metal oxide insulating layer 203. In addition, because the capacitor of the second embodiment includes two separated dielectric portions, i.e., the outer metal oxide insulating layer 203A and the inner metal oxide insulating layer 203B, to store charges, the capacitance of the capacitor in the second embodiment is larger than the capacitance of the capacitor in the first embodiment. In some embodiments, the cylindrical substrate 201 includes silicon or silicon dioxide. In some embodiments, the outer metal oxide insulating layer 203A includes hafnium zirconium oxide, zirconium oxide, hafnium oxide, titanium oxide, or combinations thereof, and the inner metal oxide insulating layer 203B includes hafnium zirconium oxide, zirconium oxide, hafnium oxide, titanium oxide, or combinations thereof. In some embodiments, etching the cylindrical substrate 201 includes any acceptable semiconductor processes. In some embodiments, forming the outer metal oxide insulating layer 203A includes performing an atomic layer deposition (ALD) process, and forming the inner metal oxide insulating layer 203B includes performing an atomic layer deposition (ALD) process.

In FIG. 1, an operation 102 includes forming a second conductive layer 204 on the metal oxide insulating layer 203 with a second temperature. Please refer to FIGS. 3A and 3B to FIGS. 4A and 4B, and FIGS. 8A and 8B to FIGS. 9A and 8B. With the help of the second temperature, the materials of the second conductive layer 204 deposit on the metal oxide insulating layer 203 and react to form the second conductive layer 204. In some embodiments, the second temperature is lower than the crystallization temperature of the metal oxide insulating layer 203. When the second temperature is lower than the crystallization temperature of the metal oxide insulating layer 203, the metal oxide insulating layer 203 is still amorphous in the operation 102. Therefore, the crystallization of the metal oxide insulating layer 203 is suspended until in the operation 103 to avoid too much degree of crystallization in the metal oxide insulating layer 203 that would induce current leakage of the capacitor. In some embodiments, the second temperature is larger than the first temperature and the second temperature is equal to or lower than 330° C., for example, equal to or lower than 320° C., equal to or lower than 310° C., equal to or lower than 300° C., equal to or lower than 290° C., or equal to or lower than 280° C. When the second temperature is larger than the first temperature, the increasing temperature gradient prepares (or favors) the crystallization of the metal oxide insulating layer 203 in the operation 103. The crystallization of the metal oxide insulating layer 203 increases the capacitance of the metal oxide insulating layer 203. In some embodiments, the second conductive layer 204 includes titanium, aluminum, titanium nitride, or combinations thereof. In some embodiments, forming the second conductive layer 204 includes performing an atomic layer deposition (ALD) process.

In the first embodiment shown in FIGS. 3A and 3B to FIGS. 4A and 4B, the second conductive layer 204 formed on the hollow cylinder of the metal oxide insulating layer 203 is also a hollow cylinder. Because the hollow cylinder of the first conductive layer 202 and the hollow cylinder of the second conductive layer 204 sandwich the metal oxide insulating layer 203 in between, this kind of shape provides a growth direction guide for the crystals in the metal oxide insulating layer 203 to grow during the operation 103. In other words, the crystallization degree of the metal oxide insulating layer 203 increases in the operation 103 to increase the capacitance of the capacitor.

In the second embodiment shown in FIGS. 8A and 8B to FIGS. 9A and 9B, the operation 102 of forming the second conductive layer 204 includes forming an outer second conductive layer 204A on the outer metal oxide insulating layer 203A, and forming an inner second conductive layer 204B on the inner metal oxide insulating layer 203B. In other words, the second conductive layer 204 in the second embodiment includes the outer second conductive layer 204A and the inner second conductive layer 204B, in which the outer second conductive layer 204A formed on the hollow cylinder of the outer metal oxide insulating layer 203A is also a hollow cylinder, and the inner second conductive layer 204B formed on the hollow cylinder of the inner metal oxide insulating layer 203B is also a hollow cylinder. Because the hollow cylinder of the first conductive layer 202 and the hollow cylinders of the outer second conductive layer 204A and the inner second conductive layer 204B sandwich the outer metal oxide insulating layer 203A and the inner metal oxide insulating layer 203B in between, this kind of shape provides a growth direction guide for the crystals in the outer metal oxide insulating layer 203A and the inner metal oxide insulating layer 203B to grow during the operation 103. In other words, the crystallization degree of the outer metal oxide insulating layer 203A and the inner metal oxide insulating layer 203B increases in the operation 103 to increase the capacitance of the capacitor. In some embodiments, the outer second conductive layer 204A includes titanium, aluminum, titanium nitride, or combinations thereof, and the inner second conductive layer 204B includes titanium, aluminum, titanium nitride, or combinations thereof. In some embodiments, forming the outer second conductive layer 204A includes performing an atomic layer deposition (ALD) process, and forming the inner second conductive layer 204B includes performing an atomic layer deposition (ALD) process.

In FIG. 1, an operation 103 includes forming an insulating layer 205 on the second conductive layer 204 with a third temperature to crystallize the metal oxide insulating layer 203 to form a crystallized metal oxide insulating layer 203', in which the second temperature is between the first temperature and the third temperature (i.e., the third temperature is larger than the second temperature, and the second temperature is larger than the first temperature). Please refer to FIGS. 4A and 4B to FIGS. 5A and 5B, and FIGS. 9A and 9B to FIGS. 10A and 10B. Because the third temperature crystallizes the metal oxide insulating layer 203, the capacitance of the capacitor increases. In some embodiments, the third temperature is equal to or larger than 330° C. and is lower than 450° C., for example, 330° C., 350° C., 370° C., 390° C., 410° C., or 430° C. When the third temperature is lower than 450° C., too much degree of crystallization in the crystallized metal oxide insulating layer 203' is avoided to prevent the current leakage in the capacitor. In some embodiments, the insulating layer 205 includes but is not limited to polycrystalline germanium. In some embodiments, forming the insulating layer 205 includes performing an atomic layer deposition (ALD) process.

In the first embodiment shown in FIGS. 4A and 4B to FIGS. 5A and 5B, the insulating layer 205 formed on the hollow cylinder of the second conductive layer 204 is also a hollow cylinder. The hollow cylinder of the insulating layer 205 that wraps the second conductive layer 204, the metal oxide insulating layer 203, and the first conductive layer 202 inside provides structural support for the capacitor with a high aspect ratio. In addition, in the case of a plurality of capacitors being formed, the insulating layer 205 provides insulation between the capacitor in the neighbor to avoid short circuits. Furthermore, the crystallized metal oxide insulating layer 203' formed in the operation 103 includes crystals uniformly aligned in lines owing to the sandwiched hollow cylinder shape mentioned above, thereby increasing the capacitance of the capacitor.

In the second embodiment shown in FIGS. 9A and 9B to FIGS. 10A and 10B, the operation 103 of forming the insulating layer 205 includes forming an outer insulating layer 205A on the outer second conductive layer 204A, and forming an inner insulating layer 205B on the inner second conductive layer 204B. In other words, the insulating layer 205 in the second embodiment includes the outer insulating layer 205A and the inner insulating layer 205B, in which the outer insulating layer 205A formed on the hollow cylinder of the outer second conductive layer 204A is also a hollow cylinder, and the inner insulating layer 205B formed on the hollow cylinder of the inner second conductive layer 204B is also a hollow cylinder. The hollow cylinder of the outer insulating layer 205A that wraps the multiple layers inside provides structural support for the capacitor with a high aspect ratio. In addition, in the case of a plurality of capacitors being formed, the outer insulating layer 205A provides insulation between the capacitor in the neighbor to avoid short circuits. Furthermore, the crystallized metal oxide insulating layer 203', i.e., the outer crystallized metal oxide insulating layer 203A' and the inner crystallized metal oxide insulating layer 203B', formed in the operation 103 includes crystals uniformly aligned in lines owing to the sandwiched hollow cylinder shape mentioned above, thereby increasing the capacitance of the capacitor. In some embodiments, the outer insulating layer 205A includes but is not limited to polycrystalline germanium, and the inner insulating layer 205B includes but is not limited to polycrystalline germanium. In some embodiments, forming the outer insulating layer 205A includes performing an atomic layer deposition (ALD) process, and forming the inner insulating layer 205B includes performing an atomic layer deposition (ALD) process.

The present disclosure also provides a method of forming a capacitor. The method includes the following operations. A metal oxide insulating layer is formed on a first conductive layer with a first temperature equal to or larger than 180° C. A second conductive layer is formed on the metal oxide insulating layer with a second temperature in a range of 280° C. to 330° C. An insulating layer is formed on the second conductive layer with a third temperature lower than 450° C., in which the third temperature is larger than the second temperature, and the second temperature is larger than the first temperature. The detail of the method according to some embodiments is provided below.

FIG. 11 is a flow chart of the method 300 described above according to some embodiments of the present disclosure. It is noted that the capacitors shown in FIGS. 2A to 10B can be used to explain the method 300 as well. Therefore, for the simplicity of the explanation, FIGS. 2A to 10B are repeated to use in the following, in which FIGS. 2A, 3A, 4A, and 5A in a top view and FIGS. 2B, 3B, 4B, and 5B in a cross-section view are schematics of the capacitor in the intermediate stages of the method 300 according to a third embodiment of the present disclosure, and FIGS. 6A, 7A, 8A, 9A, and 10A in a top view and FIGS. 6B, 7B, 8B, 9B, and 10B in a cross-section view are schematics of the capacitor in the intermediate stages of the method 300 according to a fourth embodiment of the present disclosure. Please read FIGS. 2A to 10B when reading FIG. 11.

In FIG. 11, an operation 301 includes forming a metal oxide insulating layer 203 on a first conductive layer 202 with a first temperature equal to or larger than 180° C., for example, equal to or larger than 200° C., equal to or larger than 220° C., equal to or larger than 240° C., equal to or larger than 260° C., or equal to or larger than 280° C. Please refer to FIGS. 2A and 2B to FIGS. 3A and 3B, and FIGS. 6A and 6B to FIGS. 8A and 8B. In some embodiments, before the operation 301, the first conductive layer 202 can form on any substrate, such as a cylindrical substrate 201 discussed later, and the substrate can be any shape, such as a planar plate or a cylinder. With the help of the first temperature, the materials of the metal oxide insulating layer 203 deposit on the first conductive layer 202 and react to form the metal oxide insulating layer 203. In addition, because the first temperature is lower than the second temperature of the operation 302 that is discussed later, the metal oxide insulating layer 203 formed on the first conductive layer 202 in the operation 301 is amorphous. In other words, the crystallization of the metal oxide insulating layer 203 in the operation 301 is avoided before proceeding to the operations discussed later to avoid too much degree of crystallization that would induce current leakage of the capacitor. In some embodiments, the first conductive layer 202 includes titanium, aluminum, titanium nitride, or combinations thereof. In some embodiments, the metal oxide insulating layer 203 includes hafnium zirconium oxide, zirconium oxide, hafnium oxide, titanium oxide, or combinations thereof. In some embodiments, forming the metal oxide insulating layer 203 includes performing an atomic layer deposition (ALD) process.

In some embodiments, the method 300 further includes forming the first conductive layer 202 on a cylindrical substrate 201, such as the third embodiment shown in FIGS. 2A and 2B to FIGS. 3A and 3B. Forming the first conductive layer 202 on the cylindrical substrate 201 in the third embodiment is substantially the same as forming the first conductive layer 202 on the cylindrical substrate 201 in the first embodiment. Therefore, please refer to the details recited above.

In some embodiments, the method 300 further includes forming the first conductive layer 202 on a cylindrical substrate 201, and etching the cylindrical substrate 201 to form the first conductive layer 202 in a shape of a hollow cylinder, such as the fourth embodiment shown in FIGS. 6A and 6B to FIGS. 8A and 8B. Forming the first conductive layer 202 on the cylindrical substrate 201 and etching the cylindrical substrate 201 to form the first conductive layer 202 in the shape of the hollow cylinder in the fourth embodiment is substantially the same as forming the first conductive layer 202 on the cylindrical substrate 201 and etching the cylindrical substrate 201 to form the first conductive layer 202 in the shape of the hollow cylinder in the second embodiment. Therefore, please refer to the details recited above.

In FIG. 11, an operation 302 includes forming a second conductive layer 204 on the metal oxide insulating layer 203 with a second temperature in a range of 280° C. to 330° C. Please refer to FIGS. 3A and 3B to FIGS. 4A and 4B, and FIGS. 8A and 8B to FIGS. 9A and 9B. With the help of the second temperature, the materials of the second conductive layer 204 deposit on the metal oxide insulating layer 203 and react to form the second conductive layer 204. In addition, because the second temperature is in a range of 280° C. to 330° C., for example, 280° C., 290° C., 300° C., 310° C., 320° C., or 330° C., the metal oxide insulating layer 203 in the operation 302 is amorphous. In other words, the crystallization of the metal oxide insulating layer 203 is avoided before proceeding to the operation 303 discussed later to avoid too much degree of crystallization in the metal oxide insulating layer 203 that would induce current leakage of the capacitor. Furthermore, because the second temperature is larger than the first temperature, the increasing temperature gradient prepares (or favors) the crystallization of the metal oxide insulating layer 203 in the operation 303. The crystallization of the metal oxide insulating layer 203 increases the capacitance of the metal oxide insulating layer 203. In some embodiments, the second conductive layer 204 includes titanium, aluminum, titanium nitride, or combinations thereof. In some embodiments, forming the second conductive layer 204 includes performing an atomic layer deposition (ALD) process.

In the third embodiment shown in FIGS. 3A and 3B to FIGS. 4A and 4B, the second conductive layer 204 formed on the hollow cylinder of the metal oxide insulating layer 203 is also a hollow cylinder. Because the hollow cylinder of the first conductive layer 202 and the hollow cylinder of the second conductive layer 204 sandwich the metal oxide insulating layer 203 in between, this kind of shape provides a growth direction guide for the crystals in the metal oxide insulating layer 203 to grow during the operation 303. In other words, the crystallization degree of the metal oxide insulating layer 203 increases in the operation 303 to increase the capacitance of the capacitor.

In the fourth embodiment shown in FIGS. 8A and 8B to FIGS. 9A and 9B, the operation 302 of forming the second conductive layer 204 includes forming an outer second conductive layer 204A on the outer metal oxide insulating layer 203A, and forming an inner second conductive layer 204B on the inner metal oxide insulating layer 203B. In other words, the second conductive layer 204 in the fourth embodiment includes the outer second conductive layer 204A and the inner second conductive layer 204B, in which the outer second conductive layer 204A formed on the hollow cylinder of the outer metal oxide insulating layer 203A is also a hollow cylinder, and the inner second conductive layer 204B formed on the hollow cylinder of the inner metal oxide insulating layer 203B is also a hollow cylinder. Because the hollow cylinder of the first conductive layer 202 and the hollow cylinders of the outer second conductive layer 204A and the inner second conductive layer 204B sandwich the outer metal oxide insulating layer 203A and the inner metal oxide insulating layer 203B in between, this kind of shape provides a growth direction guide for the crystals in the outer metal oxide insulating layer 203A and the inner metal oxide insulating layer 203B to grow during the operation 303. In other words, the crystallization degree of the outer metal oxide insulating layer 203A and the inner metal oxide insulating layer 203B increases in the operation 303 to increase the capacitance of the capacitor. In some embodiments, the outer second conductive layer 204A includes titanium, aluminum, titanium nitride, or combinations thereof, and the inner second conductive layer 204B includes titanium, aluminum, titanium nitride, or combinations thereof. In some embodiments, forming the outer second conductive layer 204A includes performing an atomic layer deposition (ALD) process, and forming the inner second conductive layer 204B includes performing an atomic layer deposition (ALD) process.

In FIG. 11, an operation 303 includes forming an insulating layer 205 on the second conductive layer 204 with a third temperature lower than 450° C., for example, lower than 430° C., lower than 410° C., lower than 390° C., lower than 370° C., or lower than 350° C., in which the third temperature is larger than the second temperature, and the second temperature is larger than the first temperature.

Please refer to FIGS. 4A and 4B to FIGS. 5A and 5B, and FIGS. 9A and 9B to FIGS. 10A and 10B. Because the third temperature is larger than the second temperature, the metal oxide insulating layer 203 crystallizes to form a crystallized metal oxide insulating layer 203' which increases the capacitance of the capacitor. In other words, before forming the insulating layer 205, the metal oxide insulating layer 203 is amorphous, and after forming the insulating layer 205, the metal oxide insulating layer 203 is crystallized. In addition, when the third temperature is lower than 450° C., too much degree of crystallization in the crystallized metal oxide insulating layer 203' is avoided to prevent the current leakage in the capacitor. In some embodiments, the insulating layer 205 includes but is not limited to polycrystalline germanium. In some embodiments, forming the insulating layer 205 includes performing an atomic layer deposition (ALD) process.

In the third embodiment shown in FIGS. 4A and 4B to FIGS. 5A and 5B, the insulating layer 205 formed on the hollow cylinder of the second conductive layer 204 is also a hollow cylinder. The hollow cylinder of the insulating layer 205 that wraps the second conductive layer 204, the metal oxide insulating layer 203, and the first conductive layer 202 inside provides structural support for the capacitor with a high aspect ratio. In addition, in the case of a plurality of capacitors being formed, the insulating layer 205 provides insulation between the capacitor in the neighbor to avoid short circuits. Furthermore, the crystallized metal oxide insulating layer 203' formed in the operation 303 includes crystals uniformly aligned in lines owing to the sandwiched hollow cylinder shape mentioned above, thereby increasing the capacitance of the capacitor.

In the fourth embodiment shown in FIGS. 9A and 9B to FIGS. 10A and 10B, the operation 303 of forming the insulating layer 205 includes forming an outer insulating layer 205A on the outer second conductive layer 204A, and forming an inner insulating layer 205B on the inner second conductive layer 204B. In other words, the insulating layer 205 in the fourth embodiment includes the outer insulating layer 205A and the inner insulating layer 205B, in which the outer insulating layer 205A formed on the hollow cylinder of the outer second conductive layer 204A is also a hollow cylinder, and the inner insulating layer 205B formed on the hollow cylinder of the inner second conductive layer 204B is also a hollow cylinder. The hollow cylinder of the outer insulating layer 205A that wraps the multiple layers inside provides structural support for the capacitor with a high aspect ratio. In addition, in the case of a plurality of capacitors being formed, the outer insulating layer 205A provides insulation between the capacitor in the neighbor to avoid short circuits. Furthermore, the crystallized metal oxide insulating layer 203', i.e., the outer crystallized metal oxide insulating layer 203A' and the inner crystallized metal oxide insulating layer 203B', formed in the operation 303 includes crystals uniformly aligned in lines owing to the sandwiched hollow cylinder shape mentioned above, thereby increasing the capacitance of the capacitor. In some embodiments, the outer insulating layer 205A includes but is not limited to polycrystalline germanium, and the inner insulating layer 205B includes but is not limited to polycrystalline germanium. In some embodiments, forming the outer insulating layer 205A includes performing an atomic layer deposition (ALD) process, and forming the inner insulating layer 205B includes performing an atomic layer deposition (ALD) process.

Figure 12:
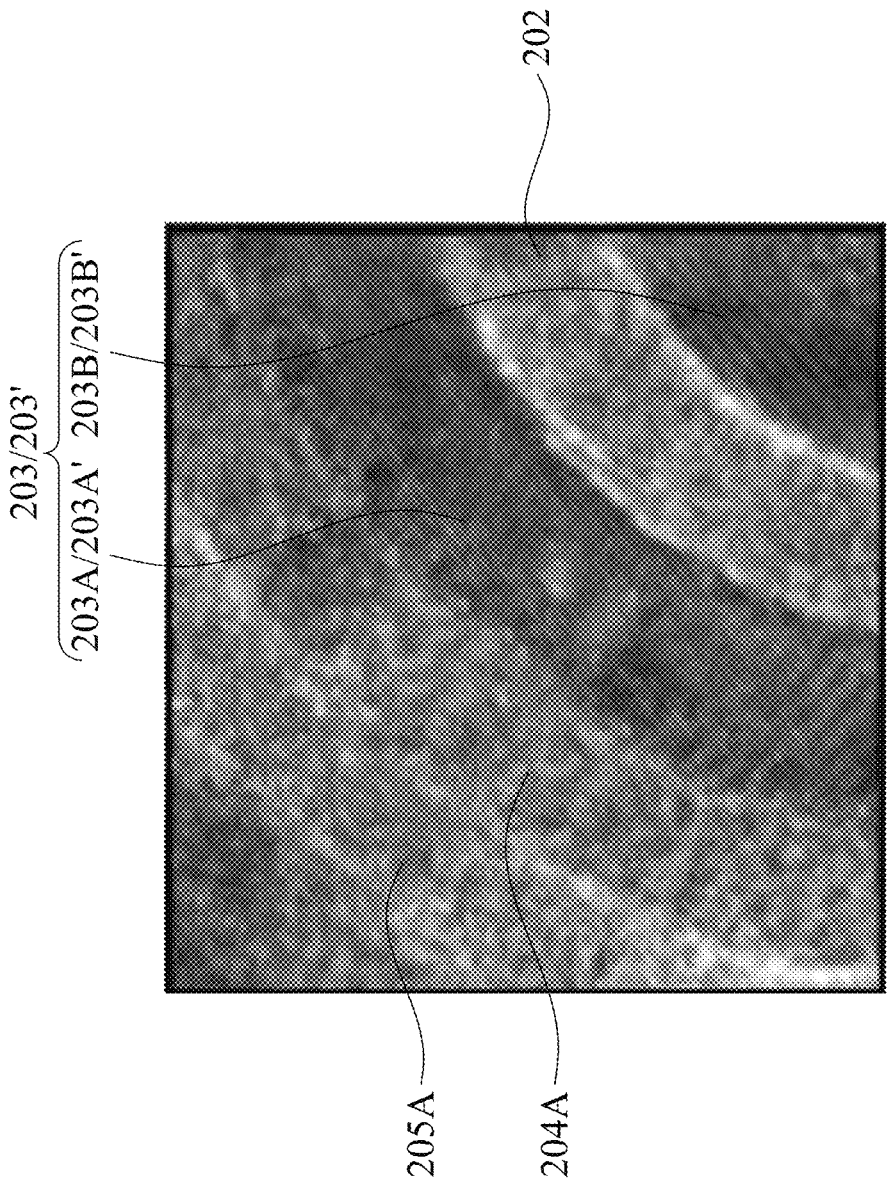
FIG. 12 is an electron microscopy image of part of the capacitor in FIG. 10A according to a second or a fourth embodiment of the present disclosure.

For a further detailed explanation of the present disclosure, the crystals uniformly aligned in lines in the crystallized metal oxide insulating layer 203' of the second or fourth embodiment are shown in an electron microscopy image of FIG. 12. FIG. 12 is the electron microscopy image taken from the area indicated in a dashed line square in FIG. 10A. In the crystallized metal oxide insulating layer 203' including the outer crystallized metal oxide insulating layer 203A' and the inner crystallized metal oxide insulating layer 203B' of FIG. 12, multiple lines under electron microscopy were found to represent the growth alignment of the crystals. The obvious crystal alignment suggests enough degree of crystallization to increase the capacitance of the capacitor. The electron microscopy images (not shown in the figures) of the first and the third embodiments also show crystals uniformly aligned in lines in the crystallized metal oxide insulating layer 203'.

The present disclosure provides methods of forming the capacitor having high capacitance and low current leakage. The methods are easy to implement by using the first temperature, the second temperature, and the third temperature in an increasing gradient while forming the capacitor. With the methods provided in the present disclosure, a capacitor with a high aspect ratio not only can be formed with improved high capacitance but also avoids unwanted current leakage.

The present disclosure is described in considerable detail with some embodiments. Other embodiments may be feasible. Therefore, the scope and spirit of the claims that are appended should not be limited to the description of the embodiments in the present disclosure.

For one skilled in the art, the present disclosure may be modified and changed as long as not departing from the spirit and scope of the present disclosure. If the modifications and changes are within the scope and spirit of the claims that are appended, they are covered by the present disclosure.

What is claimed is:

1. A method of forming a capacitor, comprising:
forming a metal oxide insulating layer on a first conductive layer with a first temperature, wherein the first temperature is lower than a crystallization temperature of the metal oxide insulating layer;
forming a second conductive layer on the metal oxide insulating layer with a second temperature, wherein the second temperature is lower than the crystallization temperature of the metal oxide insulating layer; and
forming an insulating layer on the second conductive layer with a third temperature to crystallize the metal oxide insulating layer to form a crystallized metal oxide insulating layer, wherein the second temperature is between the first temperature and the third temperature.

2. The method of claim 1, wherein the metal oxide insulating layer comprises hafnium zirconium oxide, zirconium oxide, hafnium oxide, titanium oxide, or combinations thereof.

3. The method of claim 1, wherein the first temperature is in a range of 180° C. to 280° C.

4. The method of claim 1, wherein the second temperature is larger than the first temperature and equal to or lower than 330° C.

5. The method of claim 1, wherein the third temperature is equal to or larger than 330° C. and is lower than 450° C.

6. The method of claim 1, further comprising forming the first conductive layer on a cylindrical substrate.

7. The method of claim 6, wherein the crystallized metal oxide insulating layer comprises crystals uniformly aligned in lines.

8. The method of claim 1, further comprising forming the first conductive layer on a cylindrical substrate, and etching the cylindrical substrate to form the first conductive layer in a shape of a hollow cylinder.

9. The method of claim 8, wherein:
forming the metal oxide insulating layer comprises forming an outer metal oxide insulating layer on an outer surface and an inner metal oxide insulating layer on an inner surface of the first conductive layer in the shape of the hollow cylinder;
forming the second conductive layer comprises forming an outer second conductive layer on the outer metal oxide insulating layer and an inner second conductive layer on the inner metal oxide insulating layer; and
forming the insulating layer comprises forming an outer insulating layer on the outer second conductive layer and an inner insulating layer on the inner second conductive layer.

10. The method of claim 9, wherein the crystallized metal oxide insulating layer comprises crystals uniformly aligned in lines.

11. The method of claim 1, wherein the first conductive layer comprises titanium, aluminum, titanium nitride, or combinations thereof, and the second conductive layer comprises titanium, aluminum, titanium nitride, or combinations thereof.

12. A method of forming a capacitor, comprising:
forming a metal oxide insulating layer on a first conductive layer with a first temperature equal to or larger than 180° C.;
forming a second conductive layer on the metal oxide insulating layer with a second temperature in a range of 280° C. to 330° C.; and
forming an insulating layer on the second conductive layer with a third temperature lower than 450° C., wherein the third temperature is larger than the second temperature, and the second temperature is larger than the first temperature.

13. The method of claim 12, wherein before forming the insulating layer, the metal oxide insulating layer is amorphous, and after forming the insulating layer, the metal oxide insulating layer is crystallized.

14. The method of claim 12, wherein the metal oxide insulating layer comprises hafnium zirconium oxide, zirconium oxide, hafnium oxide, titanium oxide, or combinations thereof.

15. The method of claim 13, further comprising forming the first conductive layer on a cylindrical substrate.

16. The method of claim 15, wherein the crystallized metal oxide insulating layer comprises crystals uniformly aligned in lines.

17. The method of claim 13, further comprising forming the first conductive layer on a cylindrical substrate, and etching the cylindrical substrate to form the first conductive layer in a shape of a hollow cylinder.

18. The method of claim 17, wherein:
forming the metal oxide insulating layer comprises forming an outer metal oxide insulating layer on an outer surface and an inner metal oxide insulating layer on an inner surface of the first conductive layer in the shape of the hollow cylinder;
forming the second conductive layer comprises forming an outer second conductive layer on the outer metal oxide insulating layer and an inner second conductive layer on the inner metal oxide insulating layer; and forming the insulating layer comprises forming an outer insulating layer on the outer second conductive layer and an inner insulating layer on the inner second conductive layer.

19. The method of claim 18, wherein the crystallized metal oxide insulating layer comprises crystals uniformly aligned in lines.

* * * * *